United States Patent
Ng (10) Patent No.: US 9,515,033 B2
(45) Date of Patent: Dec. 6, 2016

(54) MONOLITHIC MICROWAVE INTEGRATED CIRCUIT

(71) Applicant: Kabushiki Kaisha Toshiba, Minato-ku (JP)

(72) Inventor: Choon Yong Ng, Yokohama (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 15/058,315

(22) Filed: Mar. 2, 2016

(65) Prior Publication Data

US 2016/0307856 A1 Oct. 20, 2016

(30) Foreign Application Priority Data

Apr. 20, 2015 (JP) .................. 2015-086127
Apr. 20, 2015 (JP) .................. 2015-086128

(51) Int. Cl.
| | |
|---|---|
| *H01L 23/58* | (2006.01) |
| *H01L 23/66* | (2006.01) |
| *H01L 29/20* | (2006.01) |
| *H01L 23/373* | (2006.01) |
| *H01L 23/00* | (2006.01) |

(52) U.S. Cl.
CPC .......... *H01L 23/66* (2013.01); *H01L 23/3732* (2013.01); *H01L 29/2003* (2013.01); *H01L 24/48* (2013.01); *H01L 2223/6611* (2013.01); *H01L 2223/6616* (2013.01); *H01L 2223/6683* (2013.01); *H01L 2224/48* (2013.01); *H01L 2924/01079* (2013.01);
(Continued)

(58) Field of Classification Search
CPC .............. H01L 23/66; H01L 2924/3011; H01L 2224/48; H01L 2924/01079; H01L 2924/30107;H01L 2224/49175; H01L 2924/1461; H03F 2200/222; H03F 2200/318; H03F 2200/387
USPC ....................... 257/664, 662, 663, 379, 684, 698,257/E21.441; 330/307, 286, 333, 277
See application file for complete search history.

(56) References Cited

U.S. PATENT DOCUMENTS

| | | | |
|---|---|---|---|
| 4,427,991 A | * | 1/1984 | Yamamura ............ H01L 23/047 257/664 |
| 7,202,673 B1 | | 4/2007 | Adlerstein |

(Continued)

FOREIGN PATENT DOCUMENTS

| | | |
|---|---|---|
| EP | 2197030 A2 | 6/2010 |
| EP | 2515435 A2 | 10/2012 |

OTHER PUBLICATIONS

Extended European Search Report mailed Sep. 15, 2016 in European Patent Application No. 16158228.3.

*Primary Examiner* — Thinh T Nguyen
(74) *Attorney, Agent, or Firm* — Oblon, McClelland, Maier & Neustadt, L.L.P.

(57) ABSTRACT

A monolithic microwave integrated circuit included a substrate, a first pad, a first line, a second line, a second pad, a third pad, a first active element, a second active element. The first line includes an input end connected to the first pad. The second line includes an input end connected to the first pad. The second and third pads are connected to the ground. The first active element includes a first gate electrode connected to the output end of the first line. The second active element includes a second gate electrode connected to the output end of the second line. The first pad is provided between the second pad and a third pad. Electrical length of the first line is equal to electrical length of the second line.

16 Claims, 8 Drawing Sheets

(52) U.S. Cl.
CPC  *H01L 2924/1461* (2013.01); *H01L 2924/3011* (2013.01); *H03F 2200/222* (2013.01)

(56) References Cited

U.S. PATENT DOCUMENTS

| | | |
|---|---|---|
| 2002/0109223 A1 | 8/2002 | Katoh |
| 2002/0180553 A1 | 12/2002 | Buer |
| 2006/0187977 A1 | 8/2006 | Notani |
| 2009/0039966 A1* | 2/2009 | Chow .................... H01L 23/66 330/307 |
| 2009/0245709 A1 | 10/2009 | Murakami |
| 2012/0268211 A1 | 10/2012 | Ng et al. |

* cited by examiner

MONOLITHIC MICROWAVE INTEGRATED CIRCUIT

CROSS-REFERENCE TO RELATED APPLICATIONS

This application is based upon and claims the benefit of priority from Japanese Patent Application No. 2015-086127, filed on Apr. 20, 2015, and Japanese Patent Application No. 2015-086128, filed on Apr. 20, 2015; the entire contents of which are incorporated herein by reference.

FIELD

Embodiments described herein relate generally a monolithic microwave integrated circuit.

BACKGROUND

A monolithic microwave integrated circuit (MMIC) is characterized by applying a GSG (ground signal ground) probe or GS/SG (ground signal/signal ground) probe to the RF probe pad of the MMIC. The transmission line of the MMIC is provided with an extraction line. The RF probe pad is connected to one end of this extraction line. In the MMIC, it is desirable to reduce circuit loss of the extraction line.

DETAILED DESCRIPTION

In general, according to one embodiment, a monolithic microwave integrated circuit included a substrate, a first pad, a first line, a second line, a second pad, a third pad, a first active element, a second active element. The substrate includes a ground. The first pad is provided on the substrate. The first line is provided on the substrate, and including an input end connected to the first pad and an output end on an opposite side of the input end. The second line is provided on the substrate and includes an input end connected to the first pad and an output end on an opposite side of the input end of the second line. The second pad is provided on the substrate and connected to the ground. The third pad is provided on the substrate and connected to the ground. The first active element is provided on the substrate and including a first gate electrode connected to the output end of the first line. The second active element is provided on the substrate and includes a second gate electrode connected to the output end of the second line. The first pad is provided between the second pad and a third pad. Electrical length from the input end of the first line to the output end of the first line is equal to electrical length from the input end of the second line to the output end of the second line.

Embodiments of the invention will now be described with reference to the drawings.

The drawings are schematic or conceptual. The relationship between the thickness and the width of each portion, and the size ratio between the portions, for instance, are not necessarily identical to those in reality. Furthermore, the same portion may be shown with different dimensions or ratios depending on the figures.

In this specification and the drawings, components similar to those described previously with reference to earlier figures are labeled with like reference numerals, and the detailed description thereof is omitted appropriately.

First Embodiment

The configuration of an MMIC according to this embodiment is described.

Figure 1:
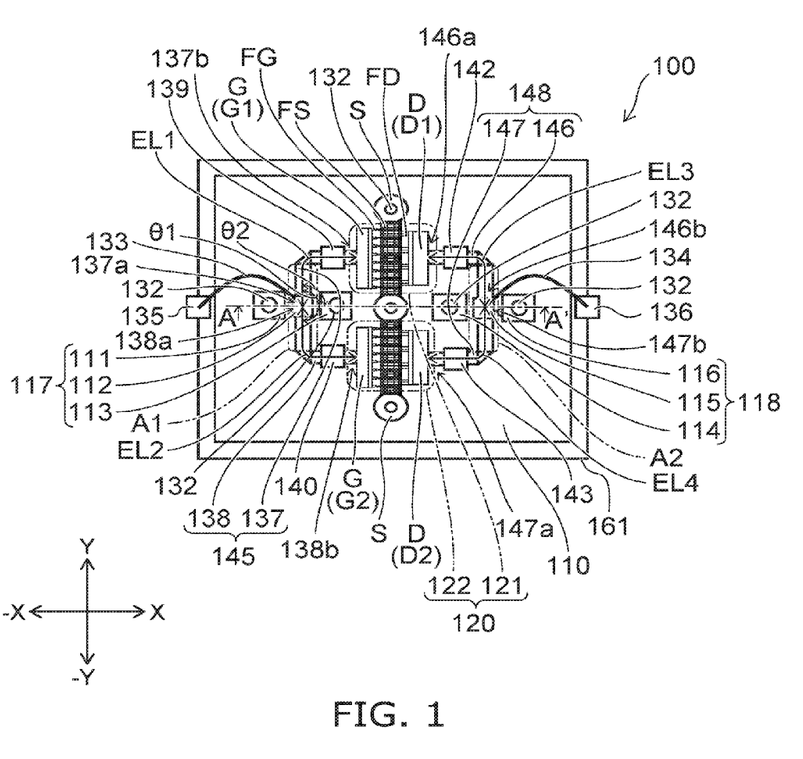
FIG. 1 is a schematic plan view illustrating the MMIC according to a first embodiment.

FIG. 1 is a schematic plan view illustrating the MMIC according to a first embodiment.

In the following, for convenience of description, an X-Y orthogonal coordinate system is adopted in this specification. For instance, in FIG. 1, the direction from the input terminal 135 to the pad 112 is referred to as "X-direction". A direction perpendicular thereto is referred to as "Y-direction". The direction opposite to the "X-direction" is referred to as "−X-direction". The direction opposite to the "Y-direction" is referred to as "−Y-direction".

As shown in FIG. 1, the MMIC 100 according to this embodiment includes a substrate 110 in a package 161. A pad part 117, a pad part 118, a transmission line 145, a transmission line 148, a capacitance element 139, a capacitance element 140, a capacitance element 142, a capacitance element 143, and an active element 120 are provided on the substrate 110. The part 117 is formed from a pad 111, a pad 112, and a pad 113. The pad part 118 is formed from a pad 114, a pad 115, and a pad 116.

The active element 120 includes a cell region (a first active element) 121 and a cell region (a second active element) 122. The cell regions 121 and 122 are formed from a finger-shaped finger gate electrode FG, a finger-shaped finger source electrode FS, and a finger-shaped finger drain electrode FD. The finger gate electrode FG, the finger source electrode FS, and the finger drain electrode FD are referred to as multi-finger electrodes MF. The finger gate electrode FG is connected to a gate terminal electrode G. The finger source electrode FS is connected to a source terminal electrode S. The finger drain electrode FD is connected to a drain terminal electrode D. The gate terminal electrode G of the cell region 121 is referred to as first gate terminal electrode G1. The gate terminal electrode G of the cell region 122 is referred to as second gate terminal electrode G2. The drain terminal electrode D of the cell region 121 is referred to as first drain terminal electrode D1. The drain terminal electrode D of the cell region 122 is referred to as second drain terminal electrode D2. The cell region 121 and the cell region 122 are e.g. HEMT (high electron mobility transistor) or MESFET (metal semiconductor field effect transistor).

An input terminal 135 provided on the package 161 is connected by a wire 133 to the pad 112 on the transmission line 145 extending in the Y-direction and the −Y-direction. The pad 111 is provided on the −X-side of the pad 112. The pad 113 is opposed to the pad 111 across the pad 112. That is, the pad 112 is provided between the pad 111 and the pad 113. The portion formed from the pad 111, the pad 112, and the pad 113 is referred to as RF probe pad.

The transmission line 145 is formed from a first transmission line 137 extending in the Y-direction and a second transmission line 138 extending in the −Y-direction from the pad 112. The first transmission line 137 includes an input end 137a and an output end 137b. The pad 112 is connected to the input end 137a. After extending in the Y-direction from the pad 112, the first transmission line 137 is bent to the X-direction and connected to the gate terminal electrode G of the cell region 121 (first gate terminal electrode G1) through the capacitance element 139. The output end 137b of the first transmission line 137 is connected to the first gate terminal electrode G1. The second transmission line 138 includes an input end 138a and an output end 138b. The pad 112 is connected to the input end 138a. After extending in the −Y-direction from the pad 112, the second transmission line 138 is bent to the X-direction and connected to the gate terminal electrode G of the cell region 122 (second gate terminal electrode G2) through the capacitance element 140. The output end 138b of the second transmission line 138 is connected to the second gate terminal electrode G2. The electrical length EL1 from the input end 137a to the output end 137b of the first transmission line 137 is nearly equal to the electrical length EL2 from the input end 138a to the output end 138b of the second transmission line 138.

The first direction Dr1 in which the first transmission line 137 extends from the pad 112 is opposite to the second direction Dr2 in which the second transmission line 138 extends from the pad 112. The angle θ1 between the first direction Dr1 in which the first transmission line 137 extends from the pad 112 and the second direction Dr2 in which the second transmission line 138 extends from the pad 112 is 180 degrees. The angle θ2 between the third direction Dr3 from the pad 111 to the pad 113 and the first direction Dr1 in which the first transmission line 137 extends from the pad 112 is 90 degrees in the pad 112.

An output terminal 136 provided on the package 161 is connected by a wire 134 to the pad 115 on the transmission line 148 extending in the Y-direction and the −Y-direction. The pad 114 is provided on the −X-side of the pad 115. The pad 116 is opposed to the pad 114 across the pad 115. That is, the pad 115 is provided between the pad 114 and the pad 116.

The transmission line 148 is formed from a third transmission line 146 extending in the Y-direction and a fourth transmission line 147 extending in the −Y-direction from the pad 115. The third transmission line 146 includes an input end 146a and an output end 146b. The pad 115 is connected to the output end 146b. After extending in the Y-direction from the pad 115, the third transmission line 146 is bent to the −X-direction and connected to the drain terminal electrode D of the cell region 121 (first drain terminal electrode D1) through the capacitance element 142. The input end 146a of the third transmission line 146 is connected to the first drain terminal electrode D1. The fourth transmission line 147 includes an input end 147a and an output end 147b. The pad 115 is connected to the output end 147b. After extending in the −Y-direction from the pad 115, the fourth transmission line 147 is bent to the −X-direction and connected to the drain terminal electrode D of the cell region 122 (second drain terminal electrode D2) through the capacitance element 143. The input end 147a of the fourth transmission line 147 is connected to the second drain terminal electrode D2. The electrical length EL3 from the input end 146a to the output end 146b of the third transmission line 146 is nearly equal to the electrical length EL4 from the input end 147a to the output end 147b of the fourth transmission line 147.

The direction in which the third transmission line 146 extends from the pad 115 is opposite to the direction in which the fourth transmission line 147 extends from the pad 115. The angle between the direction in which the third transmission line 146 extends from the pad 115 and the direction in which the fourth transmission line 147 extends from the pad 115 is 180 degrees. The angle between the direction from the pad 114 to the pad 116 and the direction in which the third transmission line 146 extends from the pad 115 is 90 degrees in the pad 115.

The number of the wires 133 and the wires 134 is not limited to one for each. The wires 133 and the wires 134 may be provided in a plurality for each.

The MMIC according to this embodiment has been described with reference to the example in which the input terminal 135 is connected through the wire 133, the transmission line 145, the capacitance element 139, and the capacitance element 140 to the cell region 121 and the cell region 122. The embodiment is not limited thereto. In the case where the cell region 121 is not provided, the pad 112 is provided on the transmission line 145. The pad 111 is provided on the −X-side of the pad 112. The pad 113 is opposed to the pad 111 across the pad 112. The angle between the direction from the pad 111 to the pad 113 and the direction in which the transmission line 145 extends from the pad 112 is 90 degrees in the pad 112.

Figure 2:
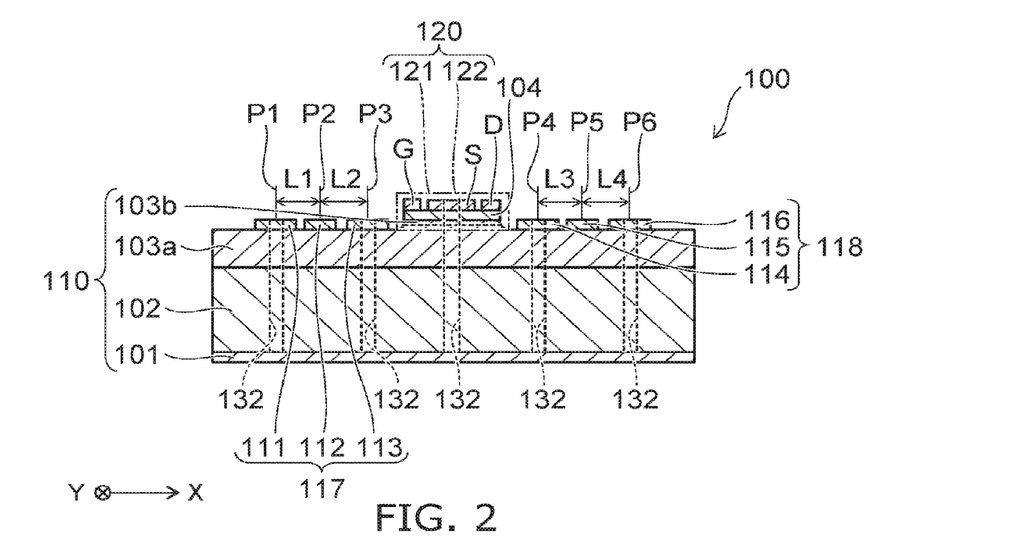
FIG. 2 is a sectional view taken along line A-A' shown in FIG. 1.

FIG. 2 is a sectional view taken along line A-A' shown in FIG. 1.

As shown in FIG. 2, the substrate 110 is formed from a ground 101, a first layer 102 provided on the ground 101, and a channel layer 103a provided on the first layer 102. The first layer is formed from e.g. silicon (Si) or silicon carbide (SiC). The channel layer 103a is formed from e.g. gallium nitride (GaN).

The pad part 117 is provided on the −X-side end part of the substrate 110. The pad 111 and the pad 113 of the pad part 117 are connected to the ground 101 through a via hole 132. The distance L1 between the center point P1 of the pad 111 and the center point P2 of the pad 112 is e.g. 250 μm (micrometers) or less. The distance L2 between the center point P2 and the center point P3 of the pad 113 is e.g. 250 μm or less. The pad part 118 is provided on the X-side end part of the substrate 110. The pad 114 and the pad 116 of the pad part 118 are connected to the ground 101 through a via hole 132. The distance L3 between the center point P4 of the pad 114 and the center point P5 of the pad 115 is e.g. 250 μm or less. The distance L4 between the center point P5 and the center point P6 of the pad 116 is e.g. 250 μm or less.

The active element 120 is provided between the pad part 117 and the pad part 118 on the substrate 110. In the active element 120, an electron supply layer 104 is provided on the channel layer 103a. Electrons moved from the electron supply layer 104 to the channel layer 103a form a two-dimensional electron gas (2DEG) layer 103b in the portion on the channel layer 103a side including the contact surface between the electron supply layer 104 and the channel layer 103a. The electron supply layer 104 is formed from e.g. aluminum gallium nitride (AlGaN).

The multi-finger electrodes MF of the active element 120 are provided on the electron supply layer 104. Among the multi-finger electrodes MF, the finger source electrodes FS are bundled and connected to the source terminal electrode S. Among the multi-finger electrodes MF, the finger gate electrodes FG are bundled and connected to the gate terminal electrode G provided on the −X-side of the source terminal electrode S. Among the multi-finger electrodes MF, the finger drain electrodes FD are bundled and connected to the drain terminal electrode D.

Figure 3:
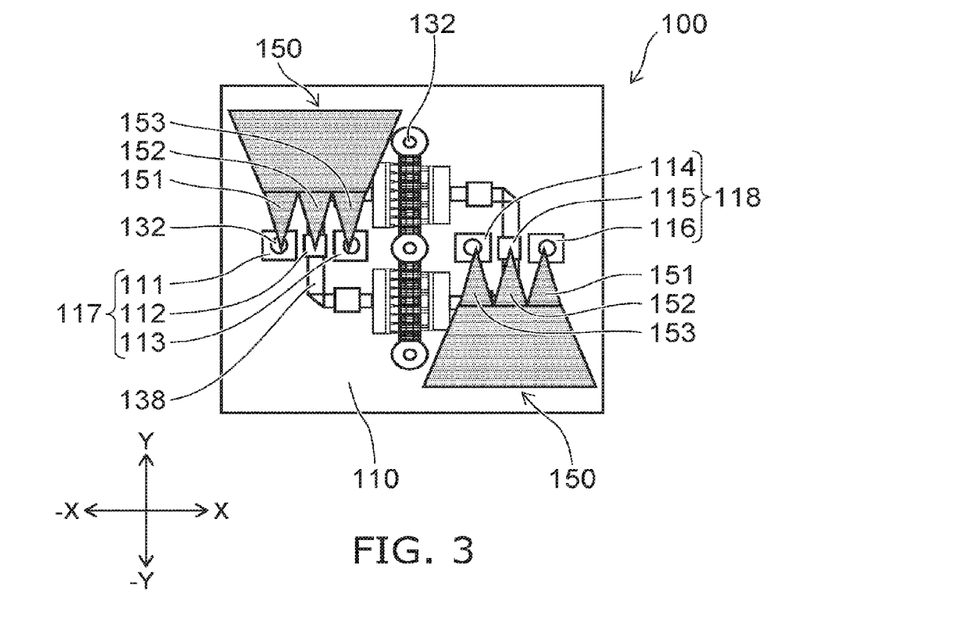
FIG. 3 is a schematic plan view illustrating the MMIC according tos the first embodiment and the GSG probe.

FIG. 3 is a schematic plan view illustrating the MMIC according to the first embodiment and the GSG probe.

As shown in FIG. 3, when characterizing the input of the MMIC 100, the GSG probe 150 is brought into contact with the pad part 117. The ground probe 151 is brought into contact with the pad 111. The signal probe 152 is brought into contact with the pad 112. The ground probe 153 is brought into contact with the pad 113. When characterizing the output of the MMIC 100, the GSG probe 150 is brought into contact with the pad part 118. When characterizing the MMIC 100, the wires 133 and 134 are not provided.

In the MMIC 100 according to this embodiment, no extraction line for connecting to the pad 112 is provided from the transmission line 145. Thus, when characterizing the MMIC 100, the pad 112 is not affected by extraction lines. Furthermore, the footprint for extraction lines can be reduced on the substrate 110.

The effect of the MMIC according to this embodiment is now described.

As shown in FIG. 1, the electrical length EL1 of the first transmission line 137 is nearly equal to the electrical length EL2 of the second transmission line 138. The first transmission line 137 and the second transmission line 138 are in contact with each other on the pad 112. That is, the pad 112 is provided at the position on the transmission line 145 where the electrical length from the first gate terminal electrode G1 of the cell region 121 is nearly equal to the electrical length from the second gate terminal electrode G2 of the cell region 122. No extraction line for connecting to the pad 112 is provided from the transmission line 145.

Thus, the loss of the transmission line 145 is lower than in the case where an extraction line is provided from the transmission line 145. In the case where an extraction line is provided, the loss of the transmission line 145 is e.g. approximately 0.2-0.3 dB (decibels). Thus, in the MMIC according to this embodiment, the noise figure (NF) can be improved by approximately 0.2-0.3 dB compared with the case where an extraction line is provided from the transmission line 145.

The pad 111 and the pad 113 spaced from the transmission line 145 are connected to the ground 101 through the via hole 132. Thus, the pad 111 and the pad 113 do not affect the transmission line 145.

Like the pad 112, the pad 115 is provided at the position on the transmission line 148 where the electrical length from the first drain terminal electrode D1 of the cell region 121 is nearly equal to the electrical length from the second drain terminal electrode D2 of the cell region 122. No extraction line for connecting to the pad 115 is provided from the transmission line 148.

In the case where an extraction line for connecting to the pad 115 is provided from the transmission line 148, the loss of the transmission line 148 is e.g. approximately 0.2-0.3 dB (decibels). Thus, in the MMIC according to this embodiment, the output power can be improved by approximately 0.2-0.3 dB compared with the case where an extraction line is provided. The pad 114 and the pad 116 are connected to the ground 101. Thus, the pad 114 and the pad 116 do not affect the transmission line 148.

Thus, no extraction line is provided on the transmission line 145 and the transmission line 148. This can provide a monolithic microwave integrated circuit reducing the circuit loss due to extraction lines.

The wire 133 may connect the input terminal 135 not only to the pad 112, but also to the transmission line 145. For instance, the wire 133 may connect the input terminal 135 to the transmission line 145 in the region A1 (see FIG. 1). The transmission line 145 in the region A1 has a larger area than the pad 112. Thus, a plurality of wires 133 can be provided. This can decrease the parasitic inductance and reduce the influence of parasitic inductance on the MMIC.

Variation of the First Embodiment

An MMIC according to this variation is described.

Figure 4:
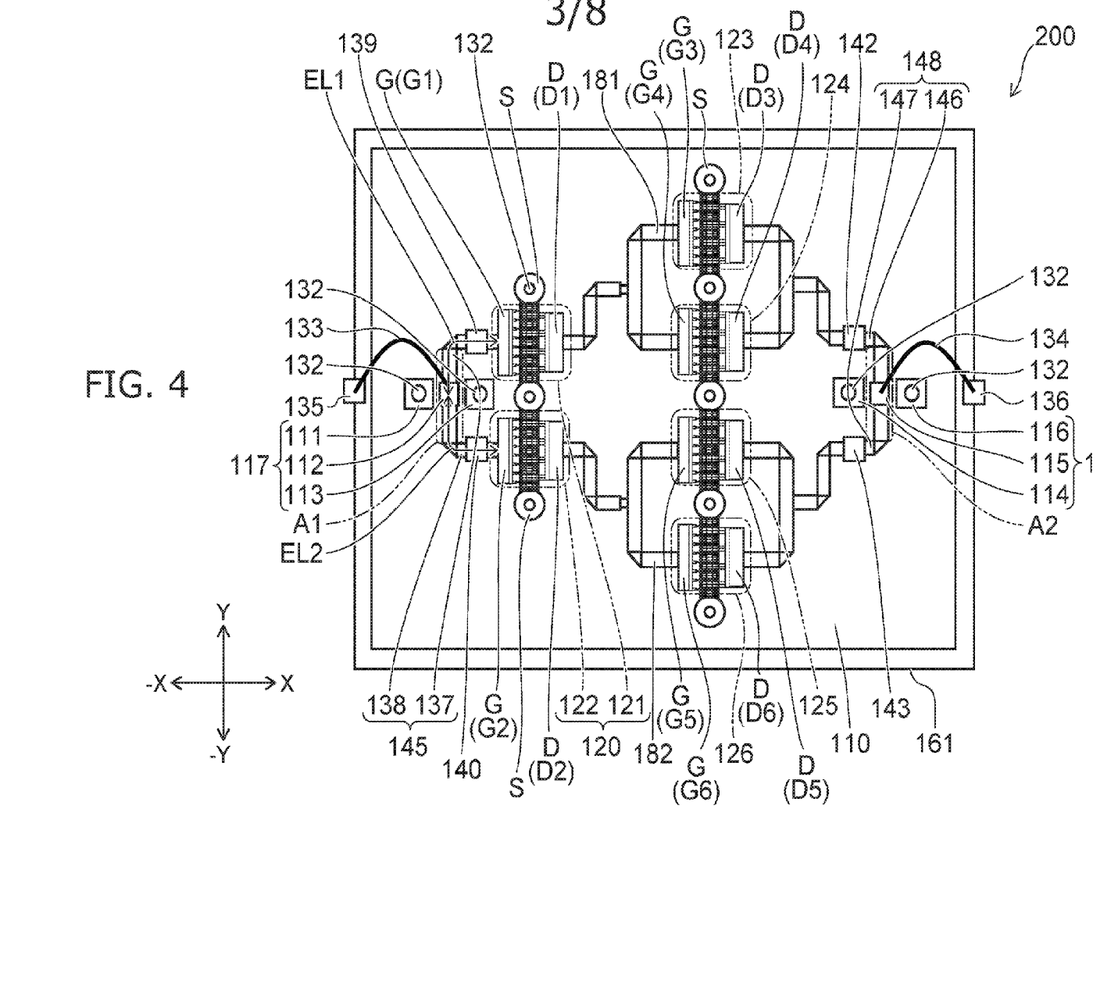
FIG. 4 is a schematic plan view illustrating the MMIC according to a variation of the first embodiment.

FIG. 4 is a schematic plan view illustrating the MMIC according to a variation of the first embodiment.

As shown in FIG. 4, the MMIC 200 according to this variation is different from the MMIC 100 (see FIG. 1) according to the above first embodiment in the following points (i) and (ii).

(i) A cell region 123 and a cell region 124 are provided between the drain terminal electrode D of the cell region 121 (first drain terminal electrode D1) and the third transmission line 146.

(ii) A cell region 125 and a cell region 126 are provided between the drain terminal electrode D of the cell region 122 (second drain terminal electrode D2) and the fourth transmission line 147.

A transmission line 181 is extracted from the first drain terminal electrode D1 of the cell region 121 and connected to the gate terminal electrode G of the cell region 123 (third gate terminal electrode G3). The transmission line 181 is branched halfway through being connected to the third gate terminal electrode G3 of the cell region 123 and parallel connected to the fourth gate terminal electrode G4 of the cell region 124. Like the transmission line 181, a transmission line 182 connects the second drain terminal electrode D2 of the cell region 122 to the fifth gate terminal electrode G5 of the cell region 125. The transmission line 182 connects the second drain terminal electrode D2 of the cell region 122 to the sixth gate terminal electrode G6 of the cell region 126.

One end of the third transmission line 146 is connected to the pad 115. The third transmission line 146 is connected to the third drain terminal electrode D3 of the cell region 123 through a capacitance element 142. The third transmission line 146 is branched halfway through being connected to the third drain terminal electrode D3 of the cell region 123 and parallel connected to the fourth drain terminal electrode D4 of the cell region 124. Like the third transmission line 146, the fourth transmission line 147 connects the pad 115 to the fifth drain terminal electrode D5 of the cell region 125. The transmission line 147 connects the pad 115 to the sixth drain terminal electrode D6 of the cell region 126.

The cell regions 123-126 thus provided increases the gain of the MMIC 200 according to this variation compared with the aforementioned MMIC 100.

The configuration and effect of the MMIC according to this variation other than the foregoing are similar to those of the above embodiment.

Comparative Example of the First Embodiment

An MMIC according to this comparative example is described.

Figure 5:
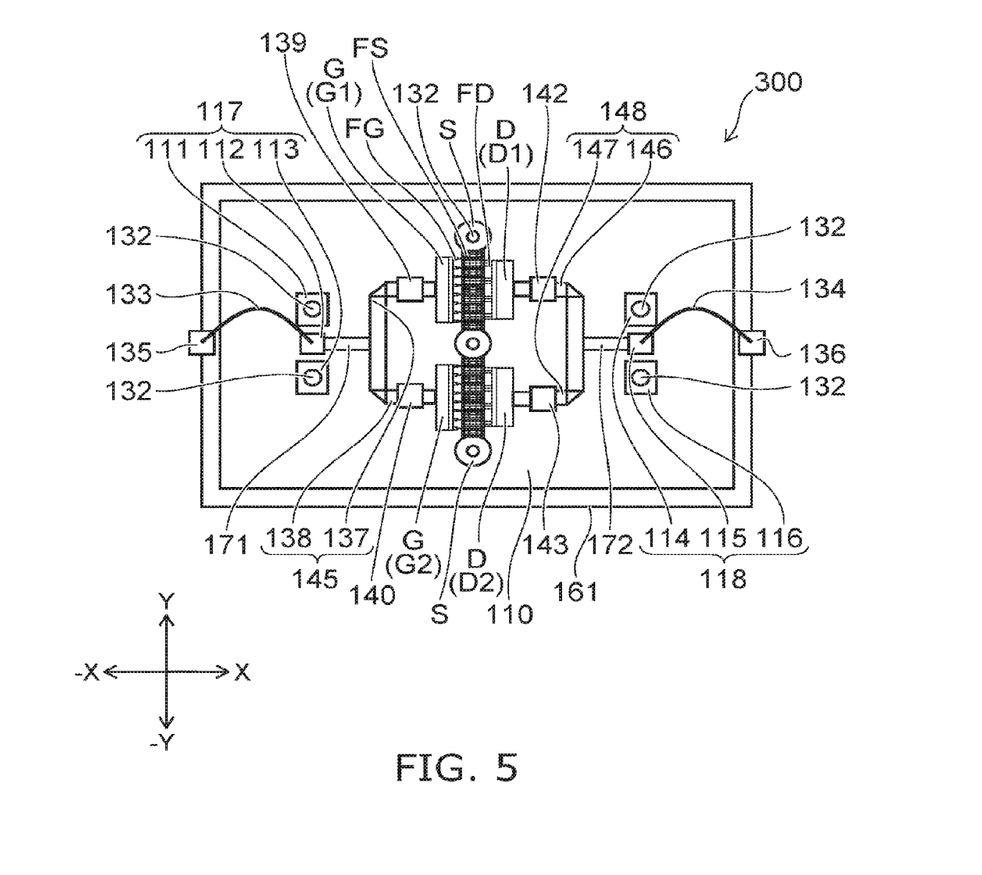
FIG. 5 is a schematic plan view illustrating the MMIC according to a first comparative example.

FIG. 5 is a schematic plan view illustrating the MMIC according to a first comparative example.

As shown in FIG. 5, the MMIC 300 according to the first comparative example is different from the MMIC 100 (see FIG. 1) according to the above embodiment in including extraction lines 171 and 172.

The extraction line 171 for connecting the pad 112 to the transmission line 145 may cause a loss of e.g. approximately 0.2-0.3 dB in the transmission line 145. Furthermore, the wire 133 can be connected only to the region on the pad 112. Thus, the number of wires 133 is restricted. This makes it difficult to reduce the parasitic inductance.

Second Embodiment

The configuration of an MMIC according to this embodiment is described.

Figure 6:
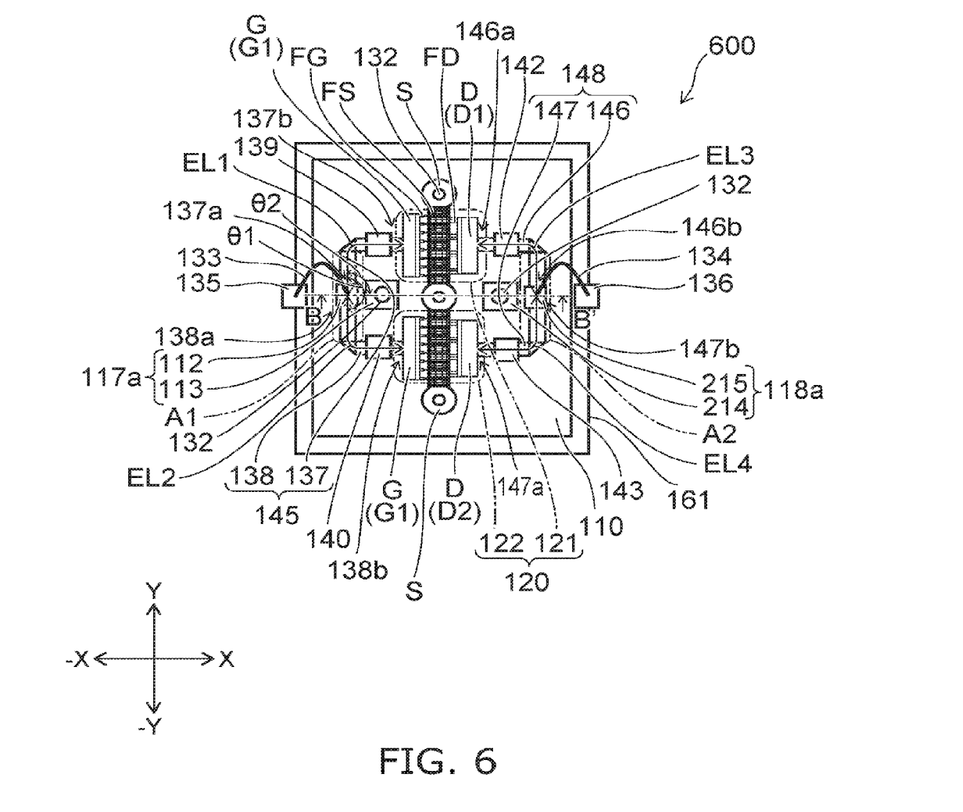
FIG. 6 is a schematic plan view illustrating the MMIC according to a second embodiment.

FIG. 6 is a schematic plan view illustrating the MMIC according to a second embodiment.

As shown in FIG. 6, the MMIC 600 according to the second embodiment includes a substrate 110 in a package 161. An RF probe pad 117a, an RF probe pad 118a, a transmission line 145, a transmission line 148, a capacitance element 139, a capacitance element 140, a capacitance element 142, a capacitance element 143, and an active element 120 are provided on the substrate 110. The RF probe pad 117a is formed from a pad 112 and a pad 113. The RF probe pad 118a is formed from a pad 214 and a pad 215.

The active element 120 includes a cell region 121 and a cell region 122. The cell regions 121 and 122 are formed from a finger-shaped finger gate electrode FG, a finger-shaped finger source electrode FS, and a finger-shaped finger drain electrode FD. The finger gate electrode FG, the finger source electrode FS, and the finger drain electrode FD are referred to as multi-finger electrodes MF. The finger gate electrode FG is connected to a gate terminal electrode G. The finger source electrode FS is connected to a source terminal electrode S. The finger drain electrode FD is connected to a drain terminal electrode D. The gate terminal electrode G of the cell region 121 is referred to as first gate terminal electrode G1. The gate terminal electrode G of the cell region 122 is referred to as second gate terminal electrode G2. The drain terminal electrode D of the cell region 121 is referred to as first drain terminal electrode D1. The drain terminal electrode D of the cell region 122 is referred to as second drain terminal electrode D2. The cell region 121 and the cell region 122 are e.g. HEMT (high electron mobility transistor) or MESFET (metal semiconductor field effect transistor).

An input terminal 135 provided on the package 161 is connected by a wire 133 to the pad 112 on the transmission line 145 extending in the Y-direction and the −Y-direction. The pad 113 is provided on the X-side of the pad 112 and spaced from the transmission line 145. The pad 113 is arranged between the pad 112 and a region including the first and second active element.

The transmission line 145 is formed from a first transmission line 137 extending in the Y-direction and a second transmission line 138 extending in the −Y-direction from the pad 112. The first transmission line 137 includes an input end 137a and an output end 137b. The pad 112 is connected to the input end 137a. After extending in the Y-direction from the pad 112, the first transmission line 137 is bent to the X-direction and connected to the gate terminal electrode G of the cell region 121 (first gate terminal electrode G1) through the capacitance element 139. The output end 137b of the first transmission line 137 is connected to the first gate terminal electrode G1. The second transmission line 138 includes an input end 138a and an output end 138b. The pad 112 is connected to the input end 138a. After extending in the −Y-direction from the pad 112, the second transmission line 138 is bent to the X-direction and connected to the gate terminal electrode G of the cell region 122 (second gate terminal electrode G2) through the capacitance element 140. The output end 138b of the second transmission line 138 is connected to the second gate terminal electrode G2. The electrical length EL1 from the input end 137a to the output end 137b of the first transmission line 137 is nearly equal to the electrical length EL2 from the input end 138a to the output end 138b of the second transmission line 138.

The first direction Dr1 in which the first transmission line 137 extends from the pad 112 is opposite to the second direction Dr2 in which the second transmission line 138 extends from the pad 112. The angle θ1 between the first direction Dr1 in which the first transmission line 137 extends from the pad 112 and the second direction Dr2 in which the second transmission line 138 extends from the pad 112 is 180 degrees. The angle θ2 between the third direction Dr3 from the pad 112 to the pad 113 and the first direction Dr1 in which the first transmission line 137 extends from the pad 112 is 90 degrees in the pad 112.

An output terminal 136 provided on the package 161 is connected by a wire 134 to the pad 115 on the transmission line 148 extending in the Y-direction and the −Y-direction. The pad 214 is provided on the −X-side of the pad 215 and spaced from the transmission line 148. The pad 214 is arranged between the pad 215 and an active region including the first and second active element.

The transmission line 148 is formed from a third transmission line 146 extending in the Y-direction and a fourth transmission line 147 extending in the −Y-direction from the pad 215. The third transmission line 146 includes an input end 146a and an output end 146b. The pad 215 is connected to the output end 146b. After extending in the Y-direction from the pad 215, the third transmission line 146 is bent to the −X-direction and connected to the drain terminal electrode D of the cell region 121 (first drain terminal electrode D1) through the capacitance element 142. The input end 146a of the third transmission line 146 is connected to the first drain terminal electrode D1. The fourth transmission line 147 includes an input end 147a and an output end 147b. The pad 215 is connected to the output end 147b. After extending in the −Y-direction from the pad 215, the fourth transmission line 147 is bent to the −X-direction and connected to the drain terminal electrode D of the cell region 122 (second drain terminal electrode D2) through the capacitance element 143. The input end 147a of the fourth transmission line 147 is connected to the second drain terminal electrode D2. The electrical length EL3 from the input end 146a to the output end 146b of the third transmission line 146 is nearly equal to the electrical length EL4 from the input end 147a to the output end 147b of the fourth transmission line 147.

The direction in which the third transmission line 146 extends from the pad 215 is opposite to the direction in which the fourth transmission line 147 extends from the pad 215. The angle between the direction in which the third transmission line 146 extends from the pad 215 and the direction in which the fourth transmission line 147 extends from the pad 215 is 180 degrees. The angle between the direction from the pad 214 to the pad 215 and the direction in which the third transmission line 146 extends from the pad 215 is 90 degrees in the pad 115.

The number of the wires 133 and the wires 134 is not limited to one for each. The wires 133 and the wires 134 may be provided in a plurality for each.

The MMIC according to this embodiment has been described with reference to the example in which the input terminal 135 is connected through the wire 133, the transmission line 145, the capacitance element 139, and the capacitance element 140 to the cell region 121 and the cell region 122. The embodiment is not limited thereto. In the case where the cell region 121 is not provided, the pad 112 is provided on the transmission line 145. The pad 113 is provided on the X-side of the pad 112 and spaced from the transmission line 145. The angle between the direction from the pad 112 to the pad 113 and the direction in which the transmission line 145 extends from the pad 112 is 90 degrees in the pad 112.

Figure 7:
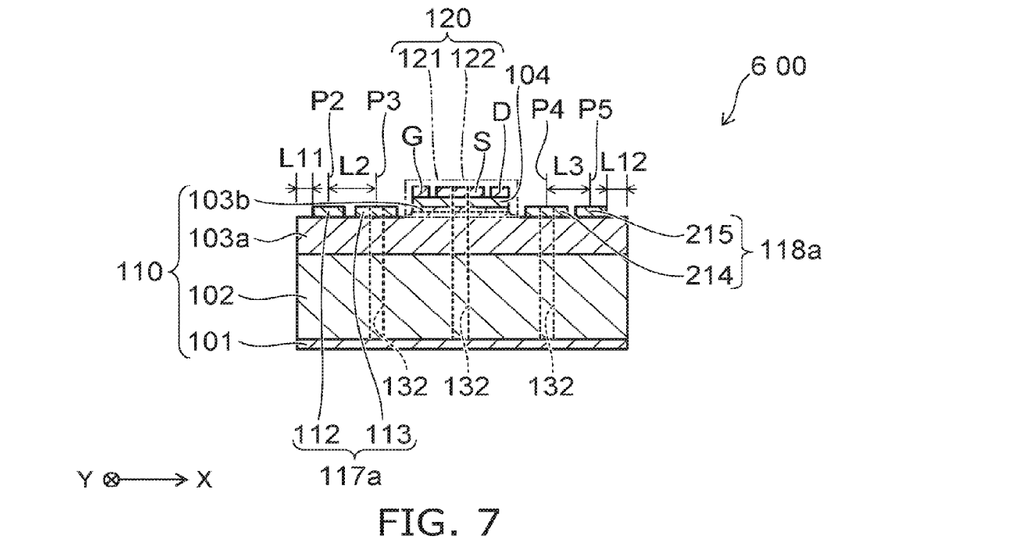
FIG. 7 is a sectional view taken along line B-B' shown in FIG. 6.

FIG. 7 is a sectional view taken along line B-B' shown in FIG. 6.

As shown in FIG. 7, the substrate 110 is formed from a ground 101, a first layer 102 provided on the ground 101, and a channel layer 103a provided on the first layer 102. The first layer is formed from e.g. silicon (Si) or silicon carbide (SiC). The channel layer 103a is formed from e.g. gallium nitride (GaN).

The RF probe pad 117a is provided on the −X-side end part of the substrate 110. The pad 113 of the RF probe pad 117a is connected to the ground 101 through a via hole 132.

The distance L2 between the center point P2 of the pad 112 and the center point P3 of the pad 113 is e.g. 600 µm (micrometers) or less. The RF probe pad 118a is provided on the X-side end part of the substrate 110. The pad 114 is connected to the ground 101 through a via hole 132. The distance L3 between the center point P4 of the pad 214 and the center point P5 of the pad 215 is e.g. 600 µm or less. The distance between the pad 112 and the −X-direction end part of the substrate 110 is referred to as distance L11. The distance between the pad 215 and the X-direction end part of the substrate 110 is referred to as distance L12.

The active element 120 is provided between the RF probe pads 117a and 118a on the substrate 110. In the active element 120, an electron supply layer 104 is provided on the channel layer 103a. Electrons moved from the electron supply layer 104 to the channel layer 103a form a two-dimensional electron gas (2DEG) layer 103b in the portion on the channel layer 103a side including the contact surface between the electron supply layer 104 and the channel layer 103a. The electron supply layer 104 is formed from e.g. aluminum gallium nitride (AlGaN).

The multi-finger electrodes MF of the active element 120 are provided on the electron supply layer 104. Among the multi-finger electrodes MF, the finger source electrodes FS are bundled and connected to the source terminal electrode S. Among the multi-finger electrodes MF, the finger gate electrodes FG are bundled and connected to the gate terminal electrode G provided on the −X-side of the source terminal electrode S. Among the multi-finger electrodes MF, the finger drain electrodes FD are bundled and connected to the drain terminal electrode D provided on the X-side of the source terminal electrode S.

Figure 8:
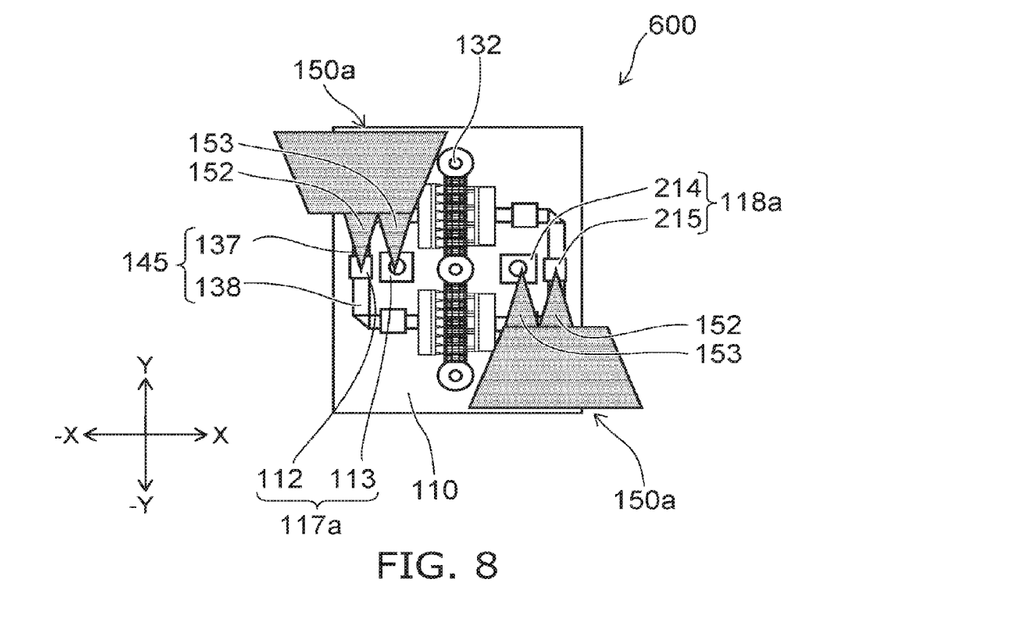
FIG. 8 is a schematic plan view illustrating the MMIC according to the second embodiment and the GS/SG probe.

FIG. 8 is a schematic plan view illustrating the MMIC according to the second embodiment and the GS/SG probe.

As shown in FIG. 8, when characterizing the input of the MMIC 600, the GS/SG probe 150a is brought into contact with the RF probe pad 117a. The signal probe 152 is brought into contact with the pad 112. The ground probe 153 is brought into contact with the pad 113. When characterizing the output of the MMIC 600, the GS/SG probe 150a is brought into contact with the RF probe pad 118a. When characterizing the MMIC 600, the wires 133 and 134 are not provided.

In the MMIC 600 according to this embodiment, no extraction line for connecting to the pad 112 is provided from the transmission line 145. Thus, when characterizing the MMIC 600, the pad 112 is not affected by extraction lines. Furthermore, the footprint for extraction lines can be reduced on the substrate 110.

The effect of the MMIC according to this embodiment is now described.

As shown in FIG. 6, the electrical length EL1 of the first transmission line 137 is nearly equal to the electrical length EL2 of the second transmission line 138. The first transmission line 137 and the second transmission line 138 are in contact with each other on the pad 112. That is, the pad 112 is provided at the position on the transmission line 145 where the electrical length from the first gate terminal electrode G1 of the cell region 121 is nearly equal to the electrical length from the second gate terminal electrode G2 of the cell region 122. No extraction line for connecting to the pad 112 is provided on the transmission line 145.

Thus, the loss of the transmission line 145 is lower than in the case where an extraction line is provided on the transmission line 145. In the case where an extraction line is provided, the loss of the transmission line 145 is e.g. approximately 0.2-0.3 dB (decibels). Thus, in the MMIC according to this embodiment, the noise figure (NF) can be improved by approximately 0.2-0.3 dB compared with the case where an extraction line is provided on the transmission line 145.

The pad 113 spaced from the transmission line 145 is connected to the ground 101 through the via hole 132. Thus, the pad 113 does not affect the transmission line 145.

Like the pad 112, the pad 215 is provided at the position on the transmission line 148 where the electrical length from the first drain terminal electrode D1 of the cell region 121 is nearly equal to the electrical length from the second drain terminal electrode D2 of the cell region 122. No extraction line for connecting to the pad 215 is provided on the transmission line 148.

In the case where an extraction line for connecting to the pad 215 is provided on the transmission line 148, the loss of the transmission line 148 is e.g. approximately 0.2-0.3 dB (decibels). Thus, in the MMIC according to this embodiment, the output power can be improved by approximately 0.2-0.3 dB compared with the case where an extraction line is provided. The pad 214 is connected to the ground 101. Thus, the pad 214 does not affect the transmission line 148.

Thus, no extraction line is provided on the transmission line 145 and the transmission line 148. This can provide a monolithic microwave integrated circuit reducing the circuit loss due to extraction lines.

The wire 133 may connect the input terminal 135 not only to the pad 112, but also to the transmission line 145. For instance, the wire 133 may connect the input terminal 135 to the transmission line 145 in the region A1 (see FIG. 6). The transmission line 145 in the region A1 has a larger area than the pad 112. Thus, a plurality of wires 133 can be provided. This can decrease the parasitic inductance and reduce the influence of parasitic inductance on the MMIC.

Furthermore, the pad 113 is provided on the X-direction side of the pad 112, and the pad 214 is provided on the −X-direction side of the pad 115. This can decrease the distance L11 between the pad 112 and the −X-direction end part of the substrate 110 and the distance L12 between the pad 215 and the X-direction end part of the substrate 110. Thus, the area of the substrate 110 can be reduced.

Variation of the Second Embodiment

An MMIC according to this variation is described.

Figure 9:
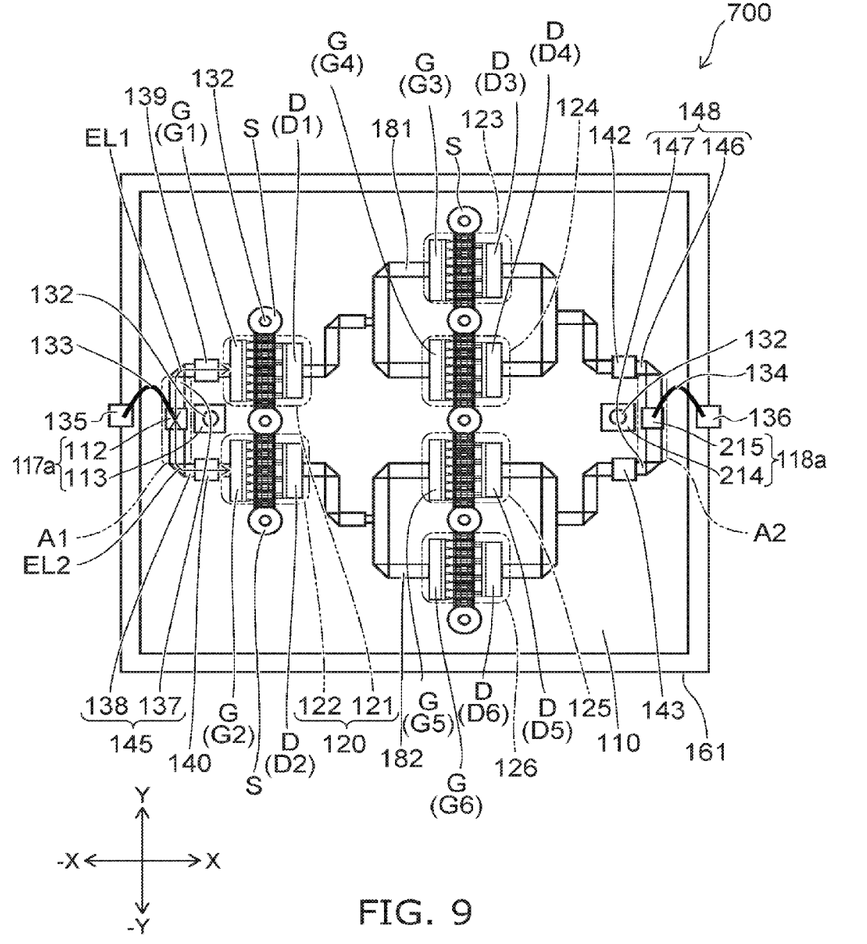
FIG. 9 is a schematic plan view illustrating the MMIC according to a variation of the second embodiment.

FIG. 9 is a schematic plan view illustrating the MMIC according to a variation of the second embodiment.

As shown in FIG. 9, the MMIC 700 according to this variation is different from the MMIC 600 (see FIG. 6) according to the above second embodiment in the following points (i) and (ii).

(i) A cell region 123 and a cell region 124 are provided between the drain terminal electrode D of the cell region 121 (first drain terminal electrode D1) and the third transmission line 146.

(ii) A cell region 125 and a cell region 126 are provided between the drain terminal electrode D of the cell region 122 (second drain terminal electrode D2) and the fourth transmission line 147.

A transmission line 181 is extracted from the first drain terminal electrode D1 of the cell region 121 and connected to the gate terminal electrode G of the cell region 123 (third gate terminal electrode G3). The transmission line 181 is branched halfway through being connected to the third gate terminal electrode G3 of the cell region 123 and parallel connected to the fourth gate terminal electrode G4 of the cell region 124. Like the transmission line 181, a transmission line 182 connects the second drain terminal electrode D2 of the cell region 122 to the fifth gate terminal electrode G5 of the cell region 125 and the sixth gate terminal electrode G6 of the cell region 126.

One end of the third transmission line 146 is connected to the pad 115. The third transmission line 146 is connected to the third drain terminal electrode D3 of the cell region 123 through a capacitance element 142. The third transmission line 146 is branched halfway through being connected to the third drain terminal electrode D3 of the cell region 123 and parallel connected to the fourth drain terminal electrode D4 of the cell region 124. Like the third transmission line 146, the fourth transmission line 147 connects the pad 215 to the fifth drain terminal electrode D5 of the cell region 125 and the sixth drain terminal electrode D6 of the cell region 126.

The cell regions 123-126 thus provided increases the power gain of the MMIC 700 according to this variation compared with the aforementioned MMIC 600.

The configuration and effect of the MMIC according to this variation other than the foregoing are similar to those of the above embodiment.

Comparative Example of the Second Embodiment

An MMIC according to this comparative example is described.

Figure 10:
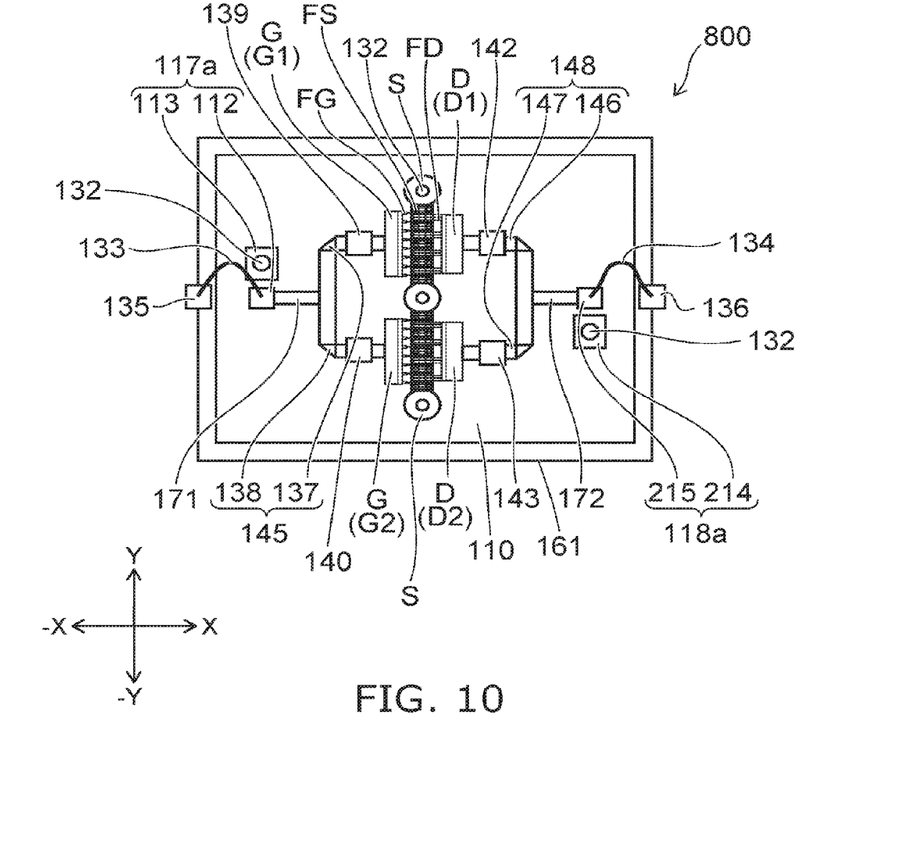
FIG. 10 is a schematic plan view illustrating the MMIC according to a second comparative example.

FIG. 10 is a schematic plan view illustrating the MMIC according to a second comparative example.

As shown in FIG. 10, the MMIC 800 according to the second comparative example is different from the MMIC 600 (see FIG. 6) according to the above embodiment in including extraction lines 171 and 172.

The extraction line 171 for connecting the pad 112 to the transmission line 145 may cause a loss of e.g. approximately 0.2-0.3 dB in the transmission line 145. Furthermore, the wire 133 can be connected only to the region on the pad 112. Thus, the number of wires 133 is restricted. This makes it difficult to reduce the parasitic inductance.

The embodiments described above can provide a monolithic microwave integrated circuit reducing the circuit loss of the extraction lines.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A monolithic microwave integrated circuit comprising:
a substrate including a ground;
a first pad provided on the substrate;
a first line provided on the substrate and including an input end connected to the first pad and an output end on an opposite side of the input end;
a second line provided on the substrate and including an input end connected to the first pad and an output end on an opposite side of the input end of the second line;
a second pad provided on the substrate and connected to the ground;
a third pad provided on the substrate and connected to the ground;
a first active element provided on the substrate and including a first gate electrode connected to the output end of the first line; and
a second active element provided on the substrate and including a second gate electrode connected to the output end of the second line,
the first pad being provided between the second pad and a third pad, and
electrical length from the input end of the first line to the output end of the first line being equal to electrical length from the input end of the second line to the output end of the second line.

2. The circuit according to claim 1, wherein
angle between first direction in which the first line extends from the first pad and second direction in which the second line extends from the first pad is 180 degrees, and
angle between third direction from the second pad to the third pad and the first direction is 90 degrees in the first pad.

3. The circuit according to claim 1, wherein the second pad and the third pad are each connected to the ground through a via hole.

4. The circuit according to claim 1, wherein
distance between center point of the first pad and center point of the second pad is 250 micrometers or less, and
distance between the center point of the first pad and center point of the third pad is 250 micrometers or less.

5. The circuit according to claim 1, further comprising:
a fourth pad provided on the substrate;
a third line provided on the substrate and including an input end and an output end connected to the fourth pad, the input end on an opposite side of the output end of the third line being connected to a first drain terminal electrode of the first active element; and
a fourth line provided on the substrate and including an input end and an output end connected to the fourth pad, the input end on an opposite side of the output end of the fourth line being connected to a second drain terminal electrode of the second active element, a fifth pad provided on the substrate and connected to the ground;

a sixth pad provided on the substrate and connected to the ground;

the fourth pad being provided between the fifth pad and a sixth pad, and electrical length from the input end of the third line to the output end of the third line being equal to electrical length from the input end of the fourth line to the output end of the fourth line.

6. The circuit according to claim 5, wherein angle between first direction in which the first line extends from the first pad and second direction in which the second line extends from the first pad is 180 degrees, angle between fourth direction from the fourth pad to the fifth pad and the first direction is 90 degrees in the fourth pad, angle between fifth direction in which the third line extends from the fourth pad and sixth direction in which the fourth line extends from the fourth pad is 180 degrees, and angle between sixth direction from the fourth pad to the fifth pad and the fourth direction is 90 degrees in the first pad.

7. The circuit according to claim 5, wherein the second, third, fifth and the sixth pads are connected to the ground through a via hole.

8. The circuit according to claim 5, wherein distance between center point of the first pad and center point of the second pad is 250 micrometers or less, distance between the center point of the first pad and center point of the third pad is 250 micrometers or less, distance between center point of the fourth pad and center point of the fifth pad is 250 micrometers or less, and distance between the center point of the fourth pad and center point of the sixth pad is 250 micrometers or less.

9. A monolithic microwave integrated circuit comprising:

a substrate including a ground;

a first pad provided on the substrate;

a first line provided on the substrate and including an input end connected to the first pad and an output end on an opposite side of the input end;

a second line provided on the substrate and including an input end connected to the first pad and an output end on an opposite side of the input end;

a first active element provided on the substrate and including a first gate electrode connected to the output end of the first line;

a second active element provided on the substrate and including a second gate electrode connected to the output end of the second line; and a second pad arranged between an active region including a first active element and the second active element on the substrate, the second pad being spaced from the first pad and connected to the ground, electrical length from the input end of the first line to the output end of the first line being equal to electrical length from the input end of the second line to the output end of the second line.

10. The circuit according to claim 9, wherein angle between first direction in which the first line extends from the first pad and second direction in which the second line extends from the first pad is 180 degrees, and angle between third direction from the first pad to the second pad and the first direction is 90 degrees in the first pad.

11. The circuit according to claim 9, wherein the second pad is connected to the ground through a via hole.

12. The circuit according to claim 9, wherein distance between center point of the first pad and center point of the second pad is 600 micrometers or less.

13. The circuit according to claim 9, further comprising:

a third pad provided on the substrate;

a third line provided on the substrate and including an input end and an output end connected to the third pad, the input end on an opposite side of the output end of the third line being connected to a first drain electrode of the first active element;

a fourth line provided on the substrate and including an input end and an output end connected to the third pad, the input end on an opposite side of the input end of the fourth line being connected to a second drain terminal of the second active element; and a fourth pad arranged between the third pad and an active region including the first and second active elements, the fourth pad being spaced from the third pad and connected to the ground, electrical length from the input end of the third line to the output end of the third line being equal to electrical length from the input end of the fourth line to the output end of the fourth line.

14. The circuit according to claim 13, wherein angle between first direction in which the first line extends from the first pad and second direction in which the second line extends from the first pad is 180 degrees, and angle between third direction from the first pad to the second pad and the first direction is 90 degrees in the first pad, angle between fourth direction in which the third line extends from the third pad and fifth direction in which the fourth line extends from the third pad is 180 degrees, and angle between sixth direction from the third pad to the fourth pad and the fourth direction is 90 degrees in the first pad.

15. The circuit according to claim 13, wherein the second and fourth pads are connected to the ground through a via hole.

16. The circuit according to claim 13, wherein distance between center point of the first pad and center point of the second pad is 600 micrometers or less, distance between center point of the third pad and center point of the forth pad is 600 micrometers or less.

* * * * *